(12) United States Patent
Bamnolker et al.

(10) Patent No.: US 6,890,859 B1
(45) Date of Patent: May 10, 2005

(54) METHODS OF FORMING SEMICONDUCTOR STRUCTURES HAVING REDUCED DEFECTS, AND ARTICLES AND DEVICES FORMED THEREBY

(75) Inventors: Hanna A. Bamnolker, Cupertino, CA (US); Chan Lon Yang, Los Gatos, CA (US); Saurabu Dutta Chowdhury, Belmont, CA (US); Krishnaswamy T. Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 125 days.

(21) Appl. No.: 09/927,863

(22) Filed: Aug. 10, 2001

(51) Int. Cl.⁷ .................. H01L 21/302; H01L 21/3065; C09K 13/00; C09K 13/06

(52) U.S. Cl. ................ 438/700; 438/706; 438/711; 438/712; 438/719; 438/723; 438/724; 252/79.1; 252/79.4

(58) Field of Search .................... 438/700, 706, 438/711, 712, 719, 723, 724; 252/79.1, 79.4

(56) References Cited

U.S. PATENT DOCUMENTS

| | | |
|---|---|---|
| 5,258,332 A | 11/1993 | Horioka et al. |
| 5,578,518 A | 11/1996 | Koike et al. |
| 5,719,085 A | 2/1998 | Moon et al. |
| 5,723,383 A * | 3/1998 | Kosugi et al. .............. 438/719 |
| 5,801,083 A | 9/1998 | Yu et al. |
| 5,843,226 A | 12/1998 | Zhao et al. |
| 5,858,857 A | 1/1999 | Ho |
| 5,863,827 A | 1/1999 | Joyner |
| 5,882,982 A | 3/1999 | Zheng et al. |
| 5,920,787 A | 7/1999 | Haskell et al. |
| 5,939,765 A | 8/1999 | Zheng et al. |
| 5,956,598 A | 9/1999 | Huang et al. |
| 5,989,977 A | 11/1999 | |
| 5,989,978 A | 11/1999 | Peidous |
| 5,994,229 A * | 11/1999 | Chen et al. ................. 438/700 |
| 6,001,706 A | 12/1999 | Tan et al. |
| 6,027,982 A | 2/2000 | Peidous et al. |
| 6,040,232 A | 3/2000 | Gau |
| 6,051,503 A * | 4/2000 | Bhardwaj et al. ........... 438/705 |
| 6,054,343 A | 4/2000 | Ashburn |
| 6,074,931 A | 6/2000 | Chang et al. |
| 6,074,932 A | 6/2000 | Wu |
| 6,080,637 A | 6/2000 | Huang et al. |
| 6,081,662 A | 6/2000 | Murakami et al. |
| 6,090,684 A | 7/2000 | Ishitsuka et al. |
| 6,096,612 A | 8/2000 | Houston .......................... Wu |

(Continued)

OTHER PUBLICATIONS

Encyclopedia of Chemical Technology, Kirk–Othmer, vol. 14, pp. 677–709 (1995).

Microchip Fabrication: A Practical Guide to Semiconductor Processing, 3rd. edition, Peter Van Zant, McGraw–Hill, Chapter 16, pp. 491–527 (2000).

*Primary Examiner*—Nadine G. Norton
*Assistant Examiner*—Lynette T. Umez-Eronini
(74) *Attorney, Agent, or Firm*—Evan Law Group LLC

(57) ABSTRACT

A method is described for forming a trench in a semiconductor substrate, which has a silicon layer, an oxide layer overlying the silicon layer, and a nitride layer overlying the oxide layer. The method includes etching the nitride layer to a nitride end point using a nitride etching chemistry, which includes a fluorinated hydrocarbon, oxygen, and an inert gas selected from the group consisting of neon, argon, krypton, xenon, and combinations thereof. Methods of making semiconductor devices, methods of reducing defects in semiconductor devices, and silicon wafers having trenches and isolation regions formed by the above-mentioned methods for forming a trench are also described.

30 Claims, 4 Drawing Sheets

Post-etch diagram

U.S. PATENT DOCUMENTS

| | | | |
|---|---|---|---|
| 6,100,131 A | * | 8/2000 | Alsmeier .................... 438/243 |
| 6,107,158 A | | 8/2000 | Zheng et al. |
| 6,110,793 A | | 8/2000 | Lee et al. |
| 6,150,234 A | | 11/2000 | Olsen |
| 6,165,854 A | | 12/2000 | Wu |
| 6,174,786 B1 | | 1/2001 | Kelley et al. |
| 6,174,787 B1 | | 1/2001 | Fuller et al. |
| 6,180,466 B1 | | 1/2001 | Ibok |
| 6,180,490 B1 | | 1/2001 | Vassiliev et al. |
| 6,214,637 B1 | * | 4/2001 | Kim et al. ..................... 438/72 |
| 6,218,309 B1 | | 4/2001 | Miller et al. |
| 6,225,187 B1 | | 5/2001 | Huang et al. |
| 6,228,727 B1 | | 5/2001 | Lim et al. |
| 6,383,941 B1 | * | 5/2002 | Shen et al. ................. 438/714 |
| 6,391,786 B1 | * | 5/2002 | Hung et al. ................. 438/706 |

* cited by examiner

METHODS OF FORMING SEMICONDUCTOR STRUCTURES HAVING REDUCED DEFECTS, AND ARTICLES AND DEVICES FORMED THEREBY

BACKGROUND

This invention relates to the field of semiconductor technology and, more particularly, to the field of shallow trench isolation.

As the dimensions and feature sizes of semiconductor devices become increasingly smaller, the electrical isolation of individual devices on a chip becomes progressively more challenging. Each device on an integrated circuit chip must be electrically isolated from neighboring devices in order to enable the independent operation of the device and to prevent short-circuiting.

One of the most widely used techniques for the isolation of semiconductor devices is known as shallow trench isolation (STI). The typical steps involved in the fabrication of an STI structure in a semiconductor substrate are illustrated in FIGS. 1-4. The semiconductor substrate 2 shown in FIG. 1 is made by forming a pad (or buffer) oxide layer 4 over a silicon layer 6. A nitride layer 8 is then deposited over the pad oxide layer 4. A photoresist layer 10 is then deposited over nitride layer 8 and patterned using photolithography to create a soft mask opening 12. The nitride layer 8 and oxide layer 4 are successively etched through soft mask opening 12 to create an opening 14, as shown in FIG. 2. Silicon layer 6 is then etched through opening 14 to form a shallow trench 16. In general, etching of the nitride layer 8, pad oxide layer 4, and silicon layer 6 is desirably achieved by anisotropic etching, such that the sidewalls of the trench formed are vertical. Photoresist 10 is removed and trench 16 is filled with a dielectric material 17 (e.g., an oxide) to provide the structure shown in FIG. 3. Chemical mechanical polishing (CMP) of this structure and removal of nitride layer 8 and pad oxide layer 4 completes the process, and provides the shallow trench isolation structure 18 shown in FIG. 4.

While STI technology has proven to be a highly effective isolation technique—one that avoids the undesirable Bird's Beak formation encountered in other isolation methodologies, such as localized oxidation of silicon (LOCOS)—the performance characteristics of devices created by STI etching can be adversely affected by the presence of sharp bottom corners 20 and sharp top corners 22 on the trench 16. Sharp bottom corners 20 may result in high stress, which leads to lattice defects in the single-crystal silicon substrate during liner oxidation, and during the subsequent filling of the trench with dielectric material. Sharp top corners 22 may result in junction leakage currents, lowered threshold voltages, and unwanted increases in sub-threshold currents when the field effect transistors (FETs) are activated. In view of these pitfalls, it is generally desirable in STI etching to form trenches having rounded top and bottom corners.

Furthermore, in order to produce semiconductor devices having high quality performance characteristics, it is desirable to reduce the number of defects formed in the silicon trench. Defects may be introduced into the semiconductor structure during deposition of the individual layers. In addition, defects may be introduced as a result of the phenomenon known as micromasking. Briefly stated, micromasking structures (also known as "cone-shaped defects" and "spikes") are generally caused by residual polymeric material produced from the etching chemistries used to etch nitride layer 8 and pad oxide layer 4. In order to achieve the corner rounding described above, it is common to employ a polymerizing chemistry to etch the oxide layer. Polymeric material is deposited on the sidewalls, which will then block the eventual silicon etch in such a way so as to cause rounding of the corners of the trench. However, residual polymeric material 21 also accumulates along the interface between adjacent layers, such as between nitride layer 8 and pad oxide layer 4, and blocks the subsequent etching of silicon layer 6 in such a way as to create cone or spike defects 19 in the silicon trench 16, as shown in FIG. 5. The defect 19 represented with a broken line in FIG. 5 can extend the entire distance from trench bottom 38 to polymeric material 21, or any fraction of this distance.

The present invention is directed to providing shallow trench isolation structures having desirable structural profiles (e.g., substantially vertical sidewalls with rounded top and bottom corners), and very low levels of cone-shaped defects.

SUMMARY

The scope of the present invention is defined solely by the appended claims, and is not affected to any degree by the statements within this summary.

In a first aspect, the present invention is a method of forming a semiconductor structure that includes (a) etching through a nitride layer; (b) etching through an oxide layer; and (c) etching a semiconductor substrate; wherein (i) a last portion of the nitride layer is etched with a nitride etching chemistry that includes a fluorinated hydrocarbon, oxygen, and an inert gas selected from the group consisting of neon, argon, krypton, xenon, and combinations thereof; (ii) a last portion of the oxide layer is etched with an oxide etching chemistry that is different from the nitride etching chemistry; and (iii) the nitride layer is on the oxide layer, and the oxide layer is on the semiconductor substrate.

In a second aspect, the present invention is a method of making a semiconductor device that includes making a semiconductor structure by the method described above, and forming a semiconductor device from the structure.

In a third aspect, the present invention is a method of making an electronic device that includes making a semiconductor device by the method described above, and forming an electronic device that includes the semiconductor device.

In a fourth aspect, the present invention is a silicon wafer that includes a plurality of semiconductor structures produced by the method described above.

In a fifth aspect, the present invention is a silicon wafer that includes at least one trench having rounded top and rounded bottom corners, wherein the trench includes a semiconductor structure produced by the method described above.

In a sixth aspect, the present invention is a silicon wafer that includes at least one isolation region, wherein the isolation region includes a trench. The trench includes a dielectric material and a semiconductor structure produced by the methods described above.

In a seventh aspect, the present invention is a method of forming a trench having reduced defects that includes (a) etching through a nitride layer; (b) etching through an oxide layer; and (c) etching a semiconductor substrate; wherein (i) a last portion of the nitride layer is etched with a nitride etching chemistry that includes a fluorinated hydrocarbon, oxygen, and an inert gas selected from the group consisting of neon, argon, krypton, xenon, and combinations thereof; (ii) a last portion of the oxide layer is etched with an oxide etching chemistry that is different from the nitride etching chemistry; (iii) the nitride layer is on the oxide layer, and the oxide layer is on the semiconductor substrate and (iv) the trench is formed by the etching of the semiconductor substrate.

DETAILED DESCRIPTION OF THE PRESENTLY PREFERRED EMBODIMENTS

Throughout this description and in the appended claims, the following definitions are to be understood: The phrase "nitride etch chemistry" refers to one or a plurality of materials used for etching a nitride layer. Similarly, the phrases "oxide etch chemistry" and "silicon etch chemistry" refer, respectively, to one or a plurality of materials used for etching an oxide layer, and to one or a plurality of materials used for etching a silicon layer. The term "end point" refers to the amount of time required to etch through a layer of a material having a particular thickness. Thus, the phrase "nitride end point" refers to the amount of time required to etch through a nitride layer having a particular thickness. The term "oxide etch time" refers to the amount of time required to etch through an oxide layer having a particular thickness. The term "overetch" refers to an amount of time beyond that required to reach the end point of an etch, and is generally expressed as a percentage of the end point.

Figure 1:
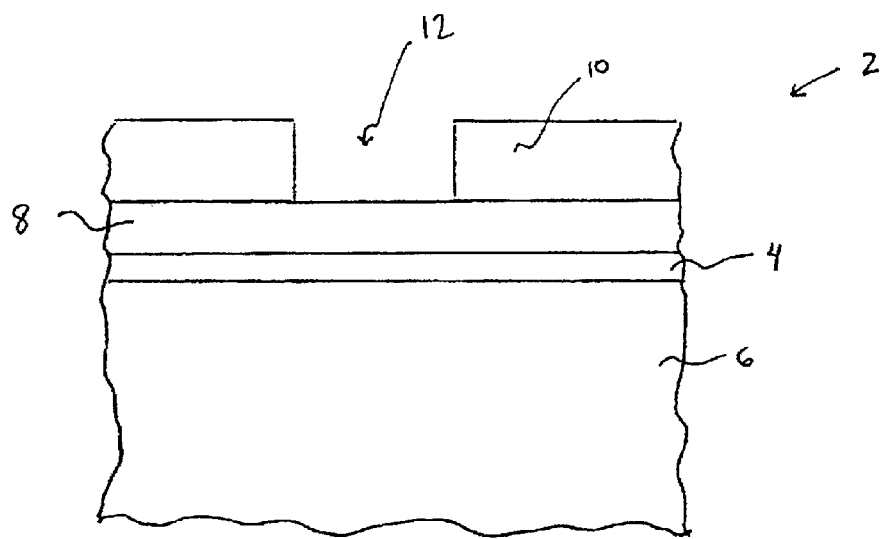
FIG. 1 shows a cross-sectional view of a semiconductor substrate.
Figure 2:
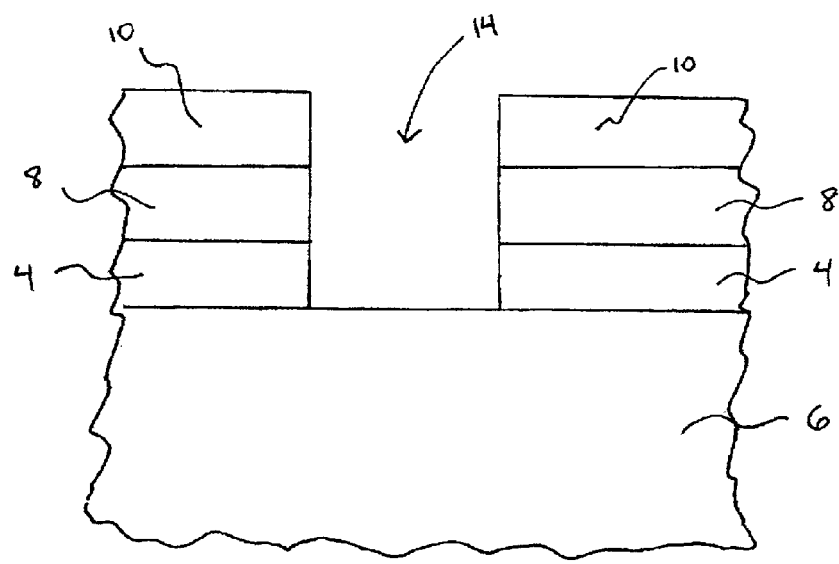
FIG. 2 shows a cross-sectional view of the semiconductor substrate of FIG. 1 after etching.
Figure 3:
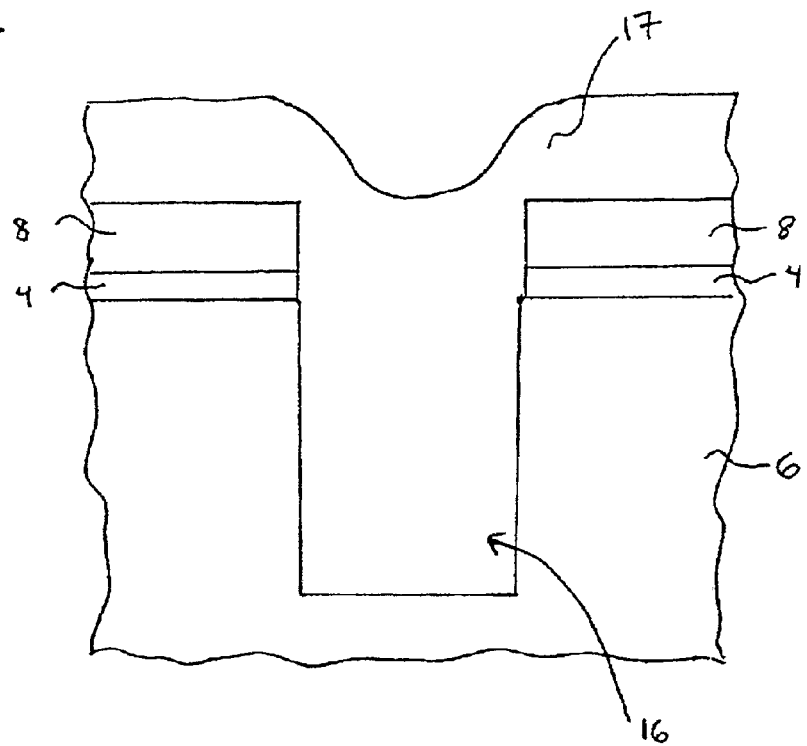
FIG. 3 shows a cross-sectional view of the semiconductor substrate of FIG. 2 after trench formation and filling.
Figure 4:
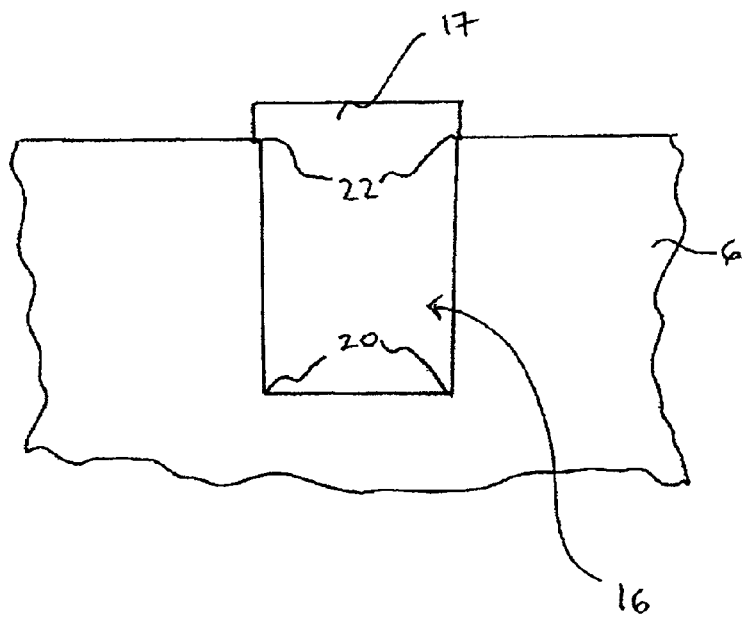
FIG. 4 shows a cross-sectional view of the semiconductor substrate of FIG. 3 after polishing and exposure of the silicon.
Figure 5:
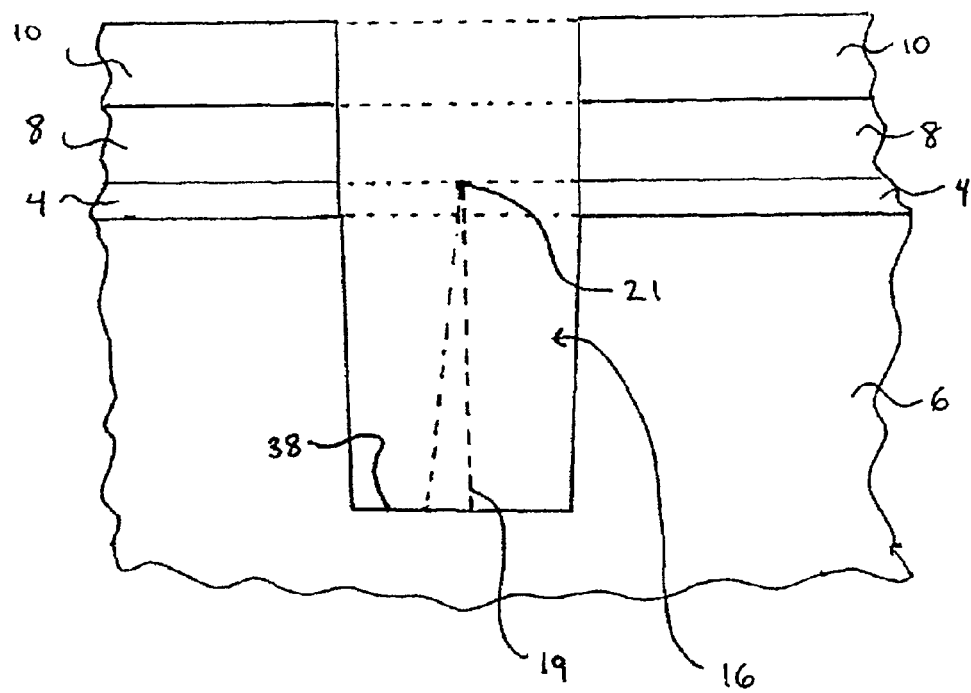
FIG. 5 illustrates the formation of a cone-shaped defect in a shallow trench isolation structure.
Figure 6:
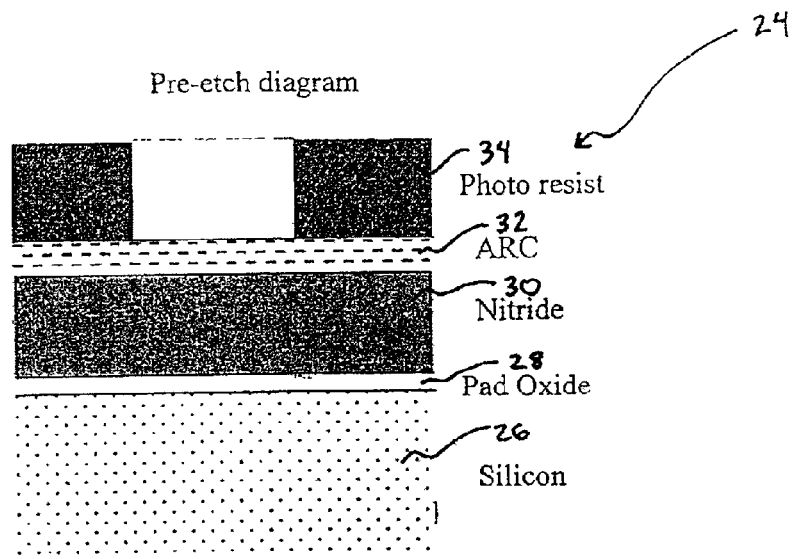
FIG. 6 shows a cross-sectional view of a semiconductor substrate for use in accordance with the present invention.

A semiconductor substrate 24 for use in accordance with the present invention is shown in FIG. 6. A silicon layer 26 in which the shallow trench structure is to be etched is provided. Silicon layer 26 can be doped or undoped, and is preferably single crystal silicon having substantially <100> orientation.

A pad oxide layer 28 (e.g., silicon oxide) is formed, typically by thermal oxidation, on the surface of silicon layer 26, and provides a stress-release layer for the structure. The thickness of pad oxide layer 28 is preferably between 20 and 500 Angstroms (Å). More preferably, the thickness is between 35 and 350 Å. Still more preferably, the thickness is between 50 and 200 Å.

A nitride layer 30 (e.g., silicon nitride or silicon oxynitride) is then deposited over pad oxide layer 28, typically by a chemical vapor deposition (CVD) process, and serves as an oxidation barrier layer and hard mask in the subsequent processing steps. The thickness of nitride layer 30 is preferably between 250 and 5000 Å. More preferably, the thickness is between 500 and 3000 Å. Still more preferably, the thickness is between 1000 and 2000 Å

An optional antireflective coating (ARC) 32 is preferably deposited over nitride layer 30, typically by spin coating, and serves to improve definition in the patterning of small images. Antireflective coating 32 reduces light scattering back into the photoresist, minimizes standing wave effects, and improves image contrast by increasing exposure latitude. The material of the antireflective coating can be either organic or inorganic. Suitable organic antireflective coatings include but are not limited to the organic coatings sold under the tradename ARC by Brewer Science, Inc. (Rolla, Mo.). The thickness of organic ARCs is preferably between 250 and 3000 Å, more preferably between 400 and 1000 Å. Suitable inorganic antireflective coatings include but are not limited to inorganic coatings containing oxynitride. The thickness of inorganic ARCs is preferably between 100 and 600 Å, more preferably between 300 and 400 Å.

A photoresist layer 34 is then deposited over ARC 32, typically by spin coating, and patterned using conventional photolithography. Preferably, photoresist 34 is patterned such that the surface of semiconductor substrate 24 is protected everywhere except a region overlying the site at which a trench is to be etched. The thickness of photoresist 34 is preferably between 0.1 and 10 microns ($\mu$). More preferably, the thickness is between 0.3 and 5$\mu$. Still more preferably, the thickness is between 0.5 and 1$\mu$.

Figure 7:
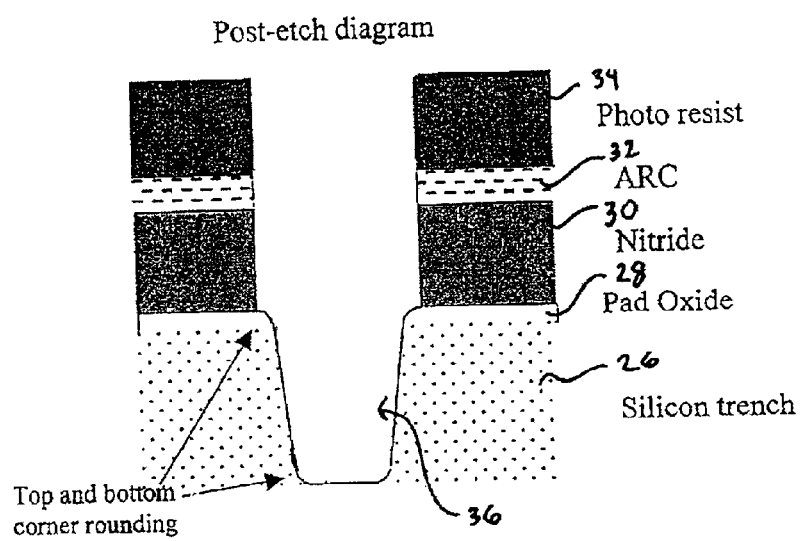
FIG. 7 shows an STI structure produced in accordance with and embodying features of the present invention.

A method of forming an STI embodying features of the present invention includes etching nitride layer 30 to a nitride end point using a nitride etching chemistry, etching pad oxide layer 28 for an oxide etch time using an oxide etching chemistry, and etching silicon layer 26 to a desired trench depth using a silicon etching chemistry. An STI structure produced in accordance with and embodying features of the present invention is shown in FIG. 7. Preferably, the depth of the trench 36 etched in silicon layer 26 is between 1000 and 5000 Å. More preferably, the depth is between 2000 and 4500 Å. Still more preferably, the depth is between 2500 and 3500 Å. In semiconductor substrates having an ARC 32 overlying nitride layer 30, both the ARC 32 and the nitride layer 30 are etched by means of the nitride etching chemistry.

Most defects in a semiconductor substrate—whether generic defects (e.g., introduced during layer deposition) or cone-shaped defects—arise during etching of the ARC (when present), nitride and oxide layers. In particular, etching of the nitride layer has been identified as a primary source of most of the undesirable polymeric residue that may lead to the formation of cone-shaped defects. Thus, it is advantageous to employ a nitride etching chemistry, such as is described more fully hereinbelow, which reduces the number of defects produced during the etching of the silicon layer.

A nitride etching chemistry in accordance with the present invention includes a fluorinated hydrocarbon, oxygen, and an inert gas. Preferably, the fluorinated hydrocarbon is selected from the group consisting of $CF_4$, $CHF_3$, $CH_2F_2$, $CH_3F$, and combinations thereof. More preferably, the fluorinated hydrocarbon is a combination of $CF_4$ and $CHF_3$. Desirably, the fluorinated hydrocarbon is a combination of $CF_4$ and $CHF_3$, wherein the ratio of the flow rate of the $CF_4$ to the flow rate of $CHF_3$ varies from ten to one up to and including one to ten, more desirably from six to one down to and including one to one. In general, the degree of corner rounding achieved and the amount of polymeric material generated increase as the proportion of $CHF_3$ in the mixture increases. An especially preferred nitride etching chemistry for use in accordance with the present invention includes $CF_4$, $CHF_3$, $O_2$, and Ar.

An alternative embodiment of a nitride etching chemistry in accordance with the present invention includes a fluorinated hydrocarbon, oxygen, an inert gas, and a hydrogen halide. Preferably, the hydrogen halide is selected from the group consisting of HF, HCl, HBr, HI, and combinations thereof. More preferably, the hydrogen halide is HBr. Preferably, the fluorinated hydrocarbon is selected from the group consisting of $CF_4$, $CHF_3$, $CH_2F_2$, $CH_3F$, and combinations thereof. More preferably, the fluorinated hydrocarbon is $CF_4$. An especially preferred alternative embodiment of a nitride etching chemistry in accordance with the present invention includes $CF_4$, HBr, $O_2$, and Ar.

While not desiring to be bound by a particular theory, it is believed that the inert gas component of the nitride etch chemistry physically bombards, and in thereby removes, a portion of the polymeric residue accumulated along the nitride/oxide interface, reducing the number of cone-shaped defects produced during the silicon etch. For this reason, it is desirable to employ a heavy inert gas in order to enhance the efficacy of this bombardment. Suitable inert gases include but are not limited to helium, neon, argon, krypton, xenon, and the like, and combinations thereof. Preferably, the inert gas component of the nitride etch chemistry has an atomic mass (in the case of an elemental species) or a molecular weight (in the case of a molecular species) of at least 20.0. More preferably, the inert gas has an atomic mass or a molecular weight of at least 39.0. Still more preferably, the inert gas is argon.

It has been found that the number of cone-shaped defects generated in the silicon trench can be further reduced by increasing the bottom electrode voltage (i.e., the bias) during introduction of the nitride etching chemistry. For example, increasing the bias from −150 to −250 V corresponds to about a twofold reduction in defects. While not desiring to be bound by a particular theory, it is believed that the increased voltage enhances the efficacy of the bombardment effect by increasing the kinetic energy of the inert gas molecules striking the polymeric residue along the interface. Thus, the use of a high bias voltage is especially advantageous when used with inert gases having a relatively low atomic mass or molecular weight. Preferably, the bias is between −50 and −500 Volts (V). More preferably, the bias is between −100 and −450 V. Still more preferably, the bias is between −125 and −400 V.

It has likewise been found that the number of cone-shaped defects generated in the silicon trench is sensitive to small adjustments in the flow rate of the oxygen. For example, increasing the oxygen flow rate from 5 to 8 standard cubic centimeters per minute (sccm) results in a further reduction in defects. Preferably, the $O_2$ has a flow rate between 1 and 20 sccm. More preferably, the $O_2$ has a flow rate between 3 and 15 sccm. Still more preferably, the $O_2$ has a flow rate between 4 and 10 sccm.

It is preferred that the nitride etching chemistry be introduced at a pressure between 1 and 50 millitorr (mTorr), and at a top power between 100 and 750 Watts (W). More preferably, the pressure is between 3 and 35 mTorr, and the top power is between 250 and 600 W. Still more preferably, the pressure is between 5 and 25 mTorr, and the top power is between 400 and 575 W.

Similarly, it is preferred that the $CF_4$ has a flow rate between 5 and 500 standard cubic centimeters per minute (sccm), the $CHF_3$ has a flow rate between 1 and 500 sccm, and the Ar has a flow rate between 25 and 500 sccm. More preferably, the $CF_4$ has a flow rate between 25 and 200 sccm, the $CHF_3$ has a flow rate between 5 and 200 sccm, and the Ar has a flow rate between 50 and 350 sccm. Still more preferably, the $CF_4$ has a flow rate between 50 and 100 sccm, the $CHF_3$ has a flow rate between 25 and 50 sccm, and the Ar has a flow rate between 75 and 250 sccm. In general, it has been found that an increase in the flow rate of the argon from 100 to 200 sccm does not substantially change the number of cone-shaped defects generated in the silicon trench.

Methods embodying features of the present invention can further include an optional overetching of the nitride layer in order to compensate for non-uniformity of the nitride layer and etch across the wafer. In such cases, overetching is performed using the nitride etching chemistry used for the etching of the nitride layer. Preferably, the overetch constitutes from 1 to 15 percent of the nitride end point. More preferably, the overetch constitutes up to and including 12 percent of the nitride end point. Still more preferably, the overetch constitutes up to and including ten percent of the nitride end point.

An oxide etching chemistry in accordance with the present invention includes a fluorinated hydrocarbon selected from the group consisting of $CF_4$, $CHF_3$, $CH_2F_2$, $CH_3F$, and combinations thereof. Preferably, the fluorinated hydrocarbon is a combination of $CF_4$ and $CHF_3$. More preferably, the fluorinated hydrocarbon is a combination of $CF_4$ and $CHF_3$, wherein the ratio of the flow rate of the $CF_4$ to the flow rate of $CHF_3$ varies from ten to one up to and including one to ten, more desirably from one to one up to and including one to six. It has been found that the number of cone-shaped defects generated in the silicon trench was reduced when the ratio of the flow rate of the $CF_4$ to the flow rate of the $CHF_3$ was changed from one to five (e.g., 20 sccm $CF_4$/100 sccm $CHF_3$) to one to two (e.g., 40 sccm $CF_4$/80 sccm $CHF_3$).

It is preferred that the oxide etching chemistry be introduced at a pressure between 5 and 200 mTorr, and at a top power between 100 and 750 W. More preferably, the pressure is between 10 and 100 mTorr, and the top power is between 250 and 600 W. Still more preferably, the pressure is between 25 and 75 mTorr, and the top power is between 400 and 575 W.

Similarly, it is preferred in the oxide etching chemistry that the $CF_4$ has a flow rate between 1 and 500 sccm, and the $CHF_3$ has a flow rate between 5 and 500 sccm. More preferably, the $CF_4$ has a flow rate between 5 and 200 sccm, and the $CHF_3$ has a flow rate between 25 and 200 sccm. Still more preferably, the $CF_4$ has a flow rate between 15 and 50 sccm, and the $CHF_3$ has a flow rate between 50 and 150 sccm.

A silicon etching chemistry in accordance with the present invention includes at least one reagent selected from the group consisting of a fluorinated hydrocarbon (e.g., $CF_4$, $CHF_3$, $CH_2F_2$, $CH_3F$, and combinations thereof), a halogen gas, a hydrogen halide, and oxygen. A preferred silicon etching chemistry includes a halogen gas selected from the group consisting of $F_2$, $Cl_2$, $Br_2$, $I_2$, and combinations thereof, a hydrogen halide gas selected from the group consisting of HF, HCl, HBr, HI, and combinations thereof, and oxygen. An especially preferred silicon etching chemistry includes $Cl_2$, HBr, and oxygen.

It is preferred that the silicon etching chemistry be introduced at a pressure between 1 and 50 mTorr, at a top power between 100 and 750 W, and at a bias between −50 and −500 V. More preferably, the pressure is between 3 and 35 mTorr, the top power is between 250 and 600 W, and the bias is between −100 and −450 V. Still more preferably, the pressure is between 5 and 25 mTorr, the top power is between 350 and 550 W, and the bias is between −125 and −400 V.

Similarly, it is preferred in the silicon etching chemistry that the $Cl_2$ has a flow rate between 5 and 500 sccm, the $O_2$ has a flow rate between 1 and 35 sccm, and the HBr has a flow rate between 50 and 500 sccm. More preferably, the $Cl_2$ has a flow rate between 10 and 200 sccm, the $O_2$ has a flow rate between 3 and 25 sccm, and the HBr has a flow rate between 75 and 450 sccm. Still more preferably, the $Cl_2$ has a flow rate between 25 and 100 sccm, the $O_2$ has a flow rate between 4 and 15 sccm, and the HBr has a flow rate between 100 and 250 sccm.

Methods embodying features of the present invention can further include an optional silicon cleaning after etching of the oxide layer has been performed, and prior to commencement of etching of the silicon layer. The number of cone-shaped defects generated in the silicon trench is slightly reduced when a silicon cleaning step is performed prior to etching of the silicon layer. While not desiring to be bound by a particular theory, it is believed that the silicon cleaning chemistry removes debris generated primarily during the etching of the oxide layer.

A silicon cleaning chemistry embodying features of the present invention includes a fluorinated hydrocarbon and an inert gas selected from the group consisting of neon, argon, krypton, xenon, and combinations thereof. Preferably, the fluorinated hydrocarbon is selected from the group consisting of $CF_4$, $CHF_3$, $CH_2F_2$, $CH_3F$, and combinations thereof. A preferred silicon cleaning chemistry includes $CF_4$ and Ar. It has been found that the use of a high bias voltage is especially advantageous when applied for the introduction of the silicon cleaning chemistry.

It is preferred that the silicon cleaning chemistry be introduced at a pressure between 1 and 40 mTorr, at a top power between 50 and 750 W, and at a bias between −50 and −500 V. More preferably, the pressure is between 2 and 30 mTorr, the top power is between 100 and 600 W, and the bias is between −100 and −450 V. Still more preferably, the pressure is between 5 and 20 mTorr, the top power is between 200 and 400 W, and the bias is between −150 and −425 V.

Similarly, by way of illustration and not of limitation, it is preferred in the silicon cleaning chemistry that the $CF_4$ has a flow rate between 5 and 500 sccm, and the Ar has a flow rate between 25 and 500 sccm. More preferably, the $CF_4$ has a flow rate between 10 and 200 sccm, and the Ar has a flow rate between 50 and 350 sccm. Still more preferably, the $CF_4$ has a flow rate between 25 and 100 sccm, and the Ar has a flow rate between 75 and 250 sccm.

Determination of the various end points encountered in the practice of preferred embodiments of the present invention (e.g., nitride end point, oxide etch time, etc.) can be made by employing one of the techniques which are well known in the art. For example, optical emission spectroscopy can be employed to monitor the intensity signal of a particular wavelength characteristic of a layer being etched, with the end point being triggered when the intensity of the signal arrives at a predetermined minimum, or is no longer detected.

STI structures embodying features of and produced in accordance with the present invention can be subjected to a variety of additional processing steps. For example, after a trench 36 has been etched in silicon layer 24, photoresist layer 34 can be removed from nitride layer 30 using conventional methodologies, such as a two-step process of dry resist stripping (also known as dry etching or ashing) followed by wet resist stripping (e.g., $H_2SO_4/H_2O_2$). A majority of the photoresist is removed in the first dry resist stripping step, with additional photoresist being removed in the second wet resist stripping step.

The semiconductor substrate produced in accordance with the present invention can be cleaned, for example, with a dilute solution of HF. Furthermore, nitride layer 30 can be removed using conventional methodologies, such as with solutions of hot phosphoric acid. Moreover, a liner oxidation of the interior of silicon trench 36 can be performed prior to filling of the trench with a dielectric material. Such a liner oxidation is typically performed under thermal conditions, and helps to compensate for damage inflicted on the interior of the trench during etching.

An STI structure produced in accordance with and embodying features of the present invention can undergo additional processing in order to produce semiconductor devices and electronic devices incorporating such semiconductor devices. For example, the trench once formed can be filled with a dielectric material (e.g., an oxide), and then subjected to a CMP process to produce a polished isolation region. The isolation region, once formed, can be used to construct a semiconductor device. For example, source/drain regions, gates, gate dielectric layers, and the like can be formed on the semiconductor substrate to make transistors, which may be connected together through dielectric layers by contacts and metallization layers. Such additional elements may be formed before, during, or after formation of the isolation regions.

STI structures embodying features of and produced in accordance with the present invention may be incorporated into a great variety of semiconductor devices, including but not limited to: integrated circuits (e.g., memory cells such as SRAM, DRAM, EPROM, EEPROM, and the like); programmable logic devices; data communications devices; clock generation devices; and so forth. Furthermore, any of these semiconductor devices may itself be incorporated into a multitude of electronic devices, including but not limited to computers, automobiles, airplanes, satellites, and the like.

Numerous additional variations in the presently preferred embodiments illustrated herein will be determined by one of ordinary skill in the art, and remain within the scope of the appended claims and their equivalents. For example, while the examples provided hereinbelow relate to silicon-based semiconductor substrates, it is contemplated that alternative semiconductor materials can likewise be employed in accordance with the present invention, and that the semiconductor substrates may be undoped, P-doped, or N-doped. Suitable semiconductor materials include but are not limited to silicon, gallium arsenide, germanium, gallium nitride, aluminum phosphide, $Si_{1-x}Ge_x$ and $Al_xGa_{1-x}As$ alloys, wherein x is greater than or equal to zero and less than or equal to one, the like, and combinations thereof. Additional examples of semiconductor materials for use in accordance with the present invention are set forth in *Semiconductor Device Fundamentals* by Robert F. Pierret (p. 4, Table 1.1, Addison-Wesley, 1996).

The following representative procedures for making embodiments of an STI in accordance with the present invention are provided solely by way of illustration, and are not intended to limit the scope of the appended claims or their equivalents.

EXAMPLES

A representative set of processing conditions for producing an STI structure embodying features of the present invention is given below in Table 1. A representative semiconductor substrate in which an STI structure having a trench depth of 3000 Å is formed includes (1) a pad oxide layer having a thickness of 125 Å, which overlies the silicon, (2) a nitride layer having a thickness of 1100 Å, 1500 Å or 1950 Å, which overlies the pad oxide layer, and (3) an organic ARC having a thickness of 780 Å, which overlies the nitride layer.

TABLE 1

|  | ARC/Nitride Etch | Pad Oxide Etch | Silicon Clean | Silicon Etch |
|---|---|---|---|---|
| Pressure (mTorr) | 10 | 50 | 10 | 10 |
| Top Power (W) | 500 | 500 | 250 | 450 |
| Bias (V) | −250 | −320 | −275 | −170 |
| $CF_4$ Flow Rate (sccm) | 70 | 20 | 50 | 0 |
| $CHF_3$ Flow Rate (sccm) | 35 | 100 | 0 | 0 |
| $O_2$ Flow Rate (sccm) | 8 | 0 | 0 | 8 |
| Ar Flow Rate (sccm) | 100 | 0 | 100 | 0 |
| $Cl_2$ Flow Rate (sccm) | 0 | 0 | 0 | 50 |
| HBr Flow Rate (sccm) | 0 | 0 | 0 | 150 |
| Backside He (Torr) | 8 | 8 | 8 | 8 |
| Completion | End Point (with or without 10% overetch) | Time | Time | Time |
| Time (sec) | 90 | 20 | 10 | 65 |
| Delay (sec) | 30 | — | — | — |
| Normalize (sec) | 5 | — | — | — |
| Threshold (%) | 85 | — | — | — |

The number of defects was reduced when the $O_2$ flow rate and bias employed in the ARC/nitride etch processing conditions were changed from 5 to 8 sccm, and from −150 to −350 V, respectively. Likewise, the number of defects was reduced when the $CF_4$ flow rate and $CHF_3$ flow rate employed in the oxide etch processing conditions were changed from 20 to 40 sccm, and from 100 to 80 sccm, respectively.

An array of different nitride etching chemistries were employed to etch a series of representative silicon nitride layers. The number of defects generated in the STI structures thereby produced was assessed by means of a KLA Tencor 2132 bright field patterned wafer inspection system, although other platform tools in the 2100 series (e.g., 2130, 2132, 2135, 2138, and 2139) as well as tools from other vendors (e.g., Applied Materials) can also be used for this purpose.

STI structures embodying features of and produced in accordance with the present invention can be subjected to stabilization procedures, as is known in the art. In general, a stabilization is not needed if an etchant plasma is already stable (e.g., a stabilization is not necessary between etching of the nitride and oxide layers). However, it is preferred that semiconductor substrates embodying features of and produced in accordance with the present invention be stabilized prior to ARC and/or nitride etching and prior to silicon etching. For example prior to initiation of the ARC and/or nitride etch, a stabilization can be performed on the semiconductor substrate, whereby the components of the nitride etching chemistry (e.g., $CF_4$, $CHF_3$, and Ar) are introduced at a pressure and flow rates resembling the pressure and flow rates to be used in the etching of the nitride layer, but at a power and bias of zero. Similarly, prior to silicon etching, a stabilization can be performed on the semiconductor substrate whereby the components of the silicon etching chemistry (e.g., $Cl_2$, HBr, and $O_2$) are introduced at a pressure and flow rates resembling the pressure and flow rates to be used in the etching of the silicon substrate, but at a power and bias of zero.

Following etching of the oxide layer and silicon cleaning, it is preferred that the top power be ramped down prior to stabilization and subsequent silicon etching. This ramping down deters the deposition of particles onto the wafer surface.

The individual semiconductor processing steps used in accordance with the present invention (e.g., etching, CVD, etc.) are well known to those of ordinary skill in the art, and are also described in numerous publications and treatises, including: *Encyclopedia of Chemical Technology, Volume 14* (Kirk-Othmer, 1995, pp. 677–709); *Semiconductor Device Fundamentals* by Robert F. Pierret (Addison-Wesley, 1996); *Silicon Processing for the VLSI Era* by Wolf (Lattice Press, 1986, 1990, 1995, vols 1–3, respectively); and *Microchip Fabrication: A Practical Guide to Semiconductor Processing* by Peter Van Zant (4th Edition, McGraw-Hill, 2000).

Obviously, numerous modifications and variations of the present invention are possible in light of the above teachings. It is therefore to be understood that within the scope of the appended claims, the invention may be practiced otherwise than as specifically described herein.

What is claimed is:

1. A method of forming a semiconductor structure comprising:
   etching through a nitride layer;
   etching through an oxide layer; and
   etching a semiconductor substrate; wherein:
      a last portion of the nitride layer is etched with a nitride etching chemistry comprising a fluorinated hydrocarbon, oxygen, and an inert gas selected from the group consisting of neon, argon, krypton, xenon, and combinations thereof;
      a last portion of the oxide layer is etched with an oxide etching chemistry that is different from the nitride etching chemistry, and the oxide etching chemistry comprises $CF_4$ and $CHF_3$; and
      the nitride layer is on the oxide layer, and the oxide layer is on the semiconductor substrate.

2. The method of claim 1 wherein an antireflective coating is on the nitride layer, and wherein the method further comprises etching the antireflective coating using the nitride etching chemistry.

3. The method of claim 1 further comprising overetching the nitride layer using the nitride etching chemistry by up to and including ten percent.

4. The method of claim 1 wherein the fluorinated hydrocarbon is selected from the group consisting of $CF_4$, $CHF_3$, $CH_2F_2$, $CH_3F$, and combinations thereof.

5. The method of claim 1 wherein the oxide etching chemistry comprises a fluorinated hydrocarbon selected from the group consisting of $CF_4$, $CHF_3$, $CH_2F_2$, $CH_3F$, and combinations thereof.

6. The method of claim 5 wherein the semiconductor substrate comprises silicon, and wherein the etching of the semiconductor substrate is achieved with a silicon etching chemistry comprising a reagent selected from the group consisting of a halogen gas, a hydrogen halide, oxygen, and combinations thereof.

7. The method of claim 1 wherein a ratio of $CF_4$ flow rate to $CHF_3$ flow rate ranges from one to one up to and including one to six.

8. The method of claim 6 wherein the silicon etching chemistry comprises $Cl_2$, HBr, and $O_2$.

9. The method of claim 1 wherein the nitride etching chemistry comprises $CF_4$, $CHF_3$, Ar, and $O_2$.

10. The method of claim 9 wherein a ratio of $CF_4$ flow rate to $CHF_3$ flow rate varies from six to one down to and Including one to one.

11. The method of claim 1 wherein the nitride etching chemistry is introduced with a bias of at least −50 V.

12. The method of claim 1 wherein a ratio of pressure top power:bias of the nitride etching chemistry is 1–50 mTorr: 100–750 W: −50—500 V.

13. The method of claim 9 wherein a ratio of pressure:top power:bias of the nitride etching chemistry is 1–50 mTorr: 100–750 W: −50—500 V.

14. The method of claim 1 wherein a ratio of $CF_4$ flow rate: $CHF_3$ flow rate is 1–500 sccm: 5–500 sccm.

15. The method of claim 6 further comprising cleaning the semiconductor substrate with a silicon cleaning chemistry comprising a fluorinated hydrocarbon and an inert gas selected from the group consisting of neon, argon, krypton, xenon, and combinations thereof.

16. The method of claim 6 further comprising cleaning the semiconductor substrate using a silicon cleaning chemistry comprising $CF_4$ and argon.

17. The method of claim 6 wherein the silicon cleaning chemistry is introduced with a bias of at least −50 V.

18. A method of forming a semiconductor structure comprising:
    etching through a nitride layer;
    etching through an oxide layer; and
    etching a semiconductor substrate, which comprises silicon; wherein:
    a last portion of the nitride layer is etched with a nitride etching chemistry comprising $CF_4$, $CHF_3$, Ar, and $O_2$;
    a last portion of the oxide layer is etched with an oxide etching chemistry that is different from the nitride etching chemistry, and the oxide etching chemistry comprises $CF_4$ and $CHF_3$;
    the semiconductor substrate is etched with a silicon etching chemistry comprising $Cl_2$, HBr, and $O_2$; and
    the nitride layer is on the oxide layer, and the oxide layer is on the semiconductor substrate.

19. A method of making a semiconductor device comprising:
    making a semiconductor structure by the method of claim 1; and
    forming a semiconductor device from the structure.

20. A method of making an electronic device comprising:
    making a semiconductor device by the method of claim 19; and forming an electronic device, which comprises the semiconductor device.

21. A method of making a semiconductor device comprising:
    making a semiconductor structure by the method of claim 18; and
    forming a semiconductor device from the structure.

22. A method of making an electronic device comprising:
    making a semiconductor device by the method of claim 21; and
    forming an electronic device, which comprises the semiconductor device.

23. A method of forming a semiconductor structure comprising:
    etching through a nitride layer;
    etching through an oxide layer;
    etching a semiconductor substrate; wherein:
    a last portion of the nitride layer is etched with a nitride etching chemistry comprising a fluorinated hydrocarbon, oxygen, and an inert gas selected from the group consisting of neon, argon, krypton, xenon, and combinations thereof;
    a last portion of the oxide layer is etched with an oxide etching chemistry that is different from the nitride etching chemistry; and
    the nitride layer is on the oxide layer, and the oxide layer is on the semiconductor substrate; and
    overetching the nitride layer using the nitride etching chemistry by up to and including ten percent.

24. The method of claim 23 wherein an antireflective coating is on the nitride layer, and wherein the method further comprises etching the antireflective coating using the nitride etching chemistry.

25. The method of claim 23 wherein the fluorinated hydrocarbon is selected from the group consisting of $CF_4$, $CHF_3$, $CH_2F_2$, $CH_3F$, and combinations thereof.

26. The method of claim 23 wherein the oxide etching chemistry comprises a fluorinated hydrocarbon selected from the group consisting of $CF_4$, $CHF_3$, $CH_2F_2$, $CH_3F$, and combinations thereof.

27. The method of claim 26 wherein the semiconductor substrate comprises silicon, and wherein the etching of the semiconductor substrate is achieved with a silicon etching chemistry comprising a reagent selected from the group consisting of a halogen gas, a hydrogen halide, oxygen, and combinations thereof.

28. The method of claim 23, wherein the oxide etching chemistry comprises $CF_4$ and $CHF_3$.

29. The method of claim 28 wherein a ratio of $CF_4$ flow rate to $CHF_3$ flow rate ranges from one to one up to and including one to six.

30. The method of claim 27 wherein the silicon etching chemistry comprises $Cl_2$, HBr, and $O_2$.

* * * * *

UNITED STATES PATENT AND TRADEMARK OFFICE
CERTIFICATE OF CORRECTION

PATENT NO. : 6,890,859 B1
DATED : May 10, 2005
INVENTOR(S) : Hanna A. Bamnolker et al.

It is certified that error appears in the above-identified patent and that said Letters Patent is hereby corrected as shown below:

Title page,
Item [75], Inventors, delete "Saurabu" and insert -- Saurabh --, also delete "T." after "Krishnaswamy".

Column 11,
Line 10, delete "pressure top" and insert -- pressure:top --.

Signed and Sealed this

Twenty-first Day of February, 2006

JON W. DUDAS
*Director of the United States Patent and Trademark Office*